(12) United States Patent
Lindemann

(10) Patent No.: US 6,617,988 B1
(45) Date of Patent: Sep. 9, 2003

(54) APPARATUS FOR ANALOGUE INFORMATION TRANSFER

(75) Inventor: Stig Lindemann, Aarhus (DK)

(73) Assignee: PR Electronics A/S, Ronde (DK)

(*) Notice: Subject to any disclaimer, the term of this patent is extended or adjusted under 35 U.S.C. 154(b) by 0 days.

(21) Appl. No.: 09/979,158

(22) PCT Filed: Aug. 23, 2000

(86) PCT No.: PCT/DK00/00466
§ 371 (c)(1),
(2), (4) Date: Mar. 22, 2002

(87) PCT Pub. No.: WO01/15321
PCT Pub. Date: Mar. 1, 2001

(30) Foreign Application Priority Data

Aug. 23, 1999 (DK) .......................... 1999 01152

(51) Int. Cl.⁷ ................................ H03M 3/00
(52) U.S. Cl. ...................... 341/143; 341/110
(58) Field of Search ................. 341/110, 143

(56) References Cited

U.S. PATENT DOCUMENTS

| | | | | |
|---|---|---|---|---|
| 4,027,152 A | * | 5/1977 | Brown et al. ............. | 359/110 |
| 4,039,950 A | * | 8/1977 | Glasbergen ............. | 375/249 |
| 4,291,405 A | * | 9/1981 | Jayant et al. ........... | 714/747 |
| 4,713,841 A | * | 12/1987 | Porter et al. ........... | 359/194 |
| 5,287,107 A | * | 2/1994 | Gampell et al. ......... | 341/137 |
| 5,870,046 A | * | 2/1999 | Scott et al. ............. | 341/143 |

FOREIGN PATENT DOCUMENTS

| | | |
|---|---|---|
| DE | 352 4871 A1 | 1/1987 |
| EP | 057 3156 A1 | 12/1993 |
| JP | 590 61333 A | 4/1984 |

* cited by examiner

Primary Examiner—Michael Tokar
Assistant Examiner—Khai M Nguyen
(74) Attorney, Agent, or Firm—Dykema Gossett PLLC

(57) ABSTRACT

A method and apparatus for generating second pulse signal from a first pulse signal. The second pulse signal has flanks positioned with a well-defined spacing. The width of the pulses as well as the frequency and phase correspond to the first signal. The apparatus employs a shape generator for generating a shape signal having uniform and well-defined flanks. A frequency generator produces a clock signal wherein the clock and phase correspond to the first pulse signal. The signal generator produces a second pulse signal from the clock signal and the shape signal for use in restoring distorted digital signals to ensure accuracy and signal integrity.

17 Claims, 6 Drawing Sheets

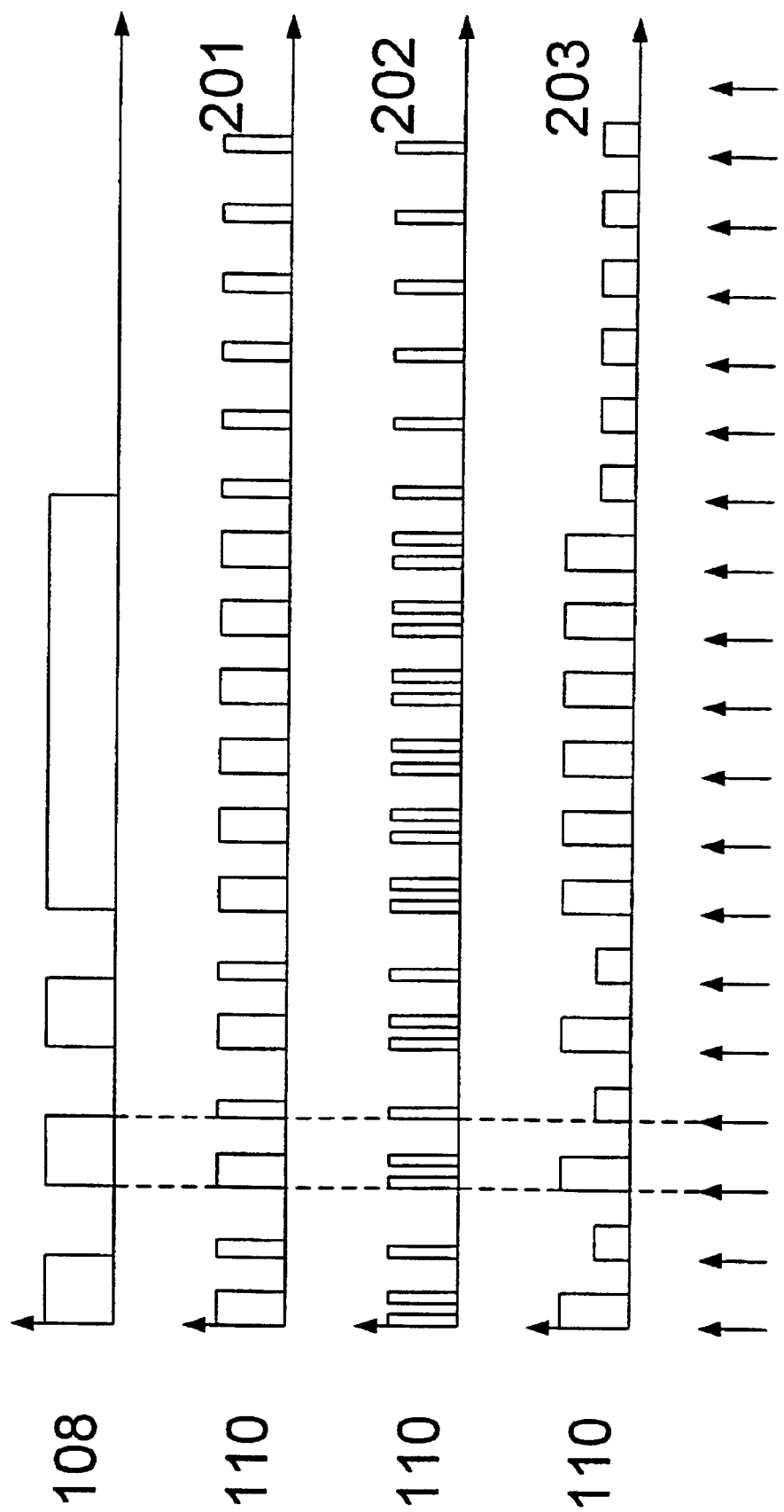

APPARATUS FOR ANALOGUE INFORMATION TRANSFER

BACKGROUND OF THE INVENTION

The invention relates to an apparatus for analogue information transfer which comprises a transmit circuit and a receive circuit. The transmit circuit communicates with the receive circuit through a transmission means, said transmit circuit generating, from a first analogue signal, a first pulse signal which is transferred to the receive circuit via the transmission means. The receive circuit generates a second analogue signal from a second pulse signal. The apparatus finds application in an extremely noisy environment.

Today digital signals are used in an ever increasing number of electronic processes. A digital signal consists of a row of pulses where each pulse consists of a rising flank and a descending flank, and where precisely the spacing between the flanks is decisive for the information in the signal. The variation in the flanks thus means that pulses with an individual mutual spacing and width are obtained, and in some signals precisely these factors are essential to the information in the signal. For the right information to be demodulated from these signals, it is also important that the flanks are uniform so that their occurrence is well-defined.

Conversion of analogue signals into digital signals and subsequent transmission of the digital signals involve the risk that noise pulses occur in the signal and that the signal is distorted. This may happen e.g. when the digital signal is communicated between two media, or when the signals move around in an electronic circuit because of interference, time delays or unilinearities in the electronic components or in the communications line.

Likewise, capacity between the conductor path or in the communications line will attenuate the high frequencies of the pulses more than the low ones and thereby round all the pulses. An analogue value based on a distorted digital signal may be vitiated by serious errors.

As a consequence of the noise pulses it may be difficult to distinguish between one of the original pulses and a noise pulse when the digital signals are demodulated, and at worst this may mean that the demodulated signal is misinterpreted. This misinterpretation may also occur because of distortion of the signal.

One way of avoiding the noise pulses is to filter the signal, but particularly in case of fast signals this filtering causes additional distortion of the signal since the filter cannot distinguish between a pulse and a noise pulse. When higher order filters are used, the filtering results in a different type of distortion of the signal as the signal history repeats itself in the later signal course. These distortions are very unfortunate in the digital signals where the integrity is of great importance. Integrity in a signal is taken to mean a signal where it is important to maintain a great accuracy with respect to the pulse sizes and the mutual positions of the pulses. These factors are essential to achieve the correct data in connection with decoding of the signal.

U.S. Pat. No. 4,027,152 discloses an apparatus for transmitting binary coded information over a fiber-optic link, which provides a link monitor to indicate whether the fiber optic link is intact and operating. The binary coded information is translated into a pulse coded signal which provides a positive pulse for positive going transition in the binary signal and a negative pulse for negative going transition in the binary signal. In addition a refresh pulse of the same polarity as the preceding pulse is provided whenever there has been no pulse for a predetermined amount of time.

The use of positive and negative pulses and a neutral level there between means that a three level analogue signal has to be transmitted over the optic fiber. Use of thee levels means that the sensitivity to noise is high because suppressing of noise between the levels is very difficult. The apparatus is not effective operating in an electric environment with a high level of noise.

SUMMARY OF THE INVENTION

The object of the invention is to achieve a precise transfer of an analogue signal through a transmission means in a noisy environment.

This may be achieved in that the first pulse signal consists of a series of coded signals, wherein a first code marks a positive flank, while a second code marks a negative flank. The receive circuit comprises a shape generator which generates a shape signal with uniform and well-defined flanks from the second pulse signal, wherein the spacing between the flanks approximately corresponds to the spacing between a first code and a second code in the first pulse signal. Rising and falling edges of the binary information are aligned with clock markings, where a refresh pulse identical with the preceding information pulse is generated, whenever the digital information does not have an edge at the respective clock marking. The receive circuit moreover contains a frequency generator which generates a clock signal on the basis of the coded pulses of the second pulse signal. The receive circuit also contains a signal generator which generates a third pulse signal from the clock signal and the shape signal, said third pulse signal generating the second analogue signal after D/A demodulation.

This provides a very precise transfer of an analogue signal through a transmission means, where the transferred analogue signal is unique in having maintained a very precise phase, and the transfer in general is unique in having a good linearity and a good noise suppression. The use of coding suppresses all other signals which do not live up to the coding criterion. Further, the coding form involves a power saving in the signal transfer, including the transmission means, which may be an advantage e.g. if the transmission means is an optocoupler.

In a particular embodiment of the apparatus, the first pulse signal transmits a code pulse at fixed intervals. It is hereby possible to transfer a clock signal and code information to the receive circuit, where the clock may be contained in the code.

In a particular embodiment of the apparatus, the first pulse signal contains a code pulse for a transmit clock signal. It is hereby possible to transfer code information to the receive circuit, whereby the clock signal may be restored precisely.

The first pulse signal may contain a first code for marking a positive flank and a second code for a negative flank, said first and second codes being transmitted at fixed intervals in dependence on an original signal. It is hereby possible to transfer a square-wave signal.

The original signal may be converted by a code generator into the first pulse signal, said code generator supplying a clock and performing coding in dependence on the clock. It is hereby possible to transfer a clock signal and a code signal to the receive circuit, where the clock may be contained in the code.

Advantageously, the original signal is generated by an analogue to digital modulator. This provides a digital signal which is less sensitive to noise than the analogue signal.

The original signal may be generated by a sigma delta modulator. This provides a digital signal which is less sensitive to noise than the analogue signal, and which can simultaneously operate at higher frequencies.

In a particular embodiment of the apparatus, the receive circuit recognizes coded pulses, and the original signal is restored on the basis of the codes. This provides a receive circuit which is capable of restoring a square-wave signal.

The receive circuit is capable of restoring the original signal by generating a positive state of the signal on the basis of the first code, while the second code generates the negative state of the signal. This provides recognition of the original signal on the basis of well-defined codes.

The apparatus is capable of restoring the clock from the coded signal in the receive circuit, said restored clock being used for determining the flanks of the signal. This provides a receive circuit which is capable of generating a clock signal from a coded signal, and which is capable of restoring the original signal from the clock signal and the code signal.

The apparatus is capable of generating a clock on the basis of the received signal in the receive circuit. This provides a receive circuit which is capable of generating a clock signal from a received signal.

In a particular embodiment of the apparatus, the receive circuit contains low-pass (LP) filtering of the second pulse signal. This provides increased noise immunity of a pulse signal.

Advantageously, the apparatus may incorporate a frequency generator with a phase-locked loop. This provides a clock signal, which is synchronous with the received signal.

The frequency generator can search for the clock within a predetermined frequency interval. This provides a clock signal which is synchronous with the received signal within a given frequency range.

The apparatus may contain the shape generator built as an analogue switching element, such as e.g. a Smith trigger. This provides a simple shape generator, which takes up very little space.

The signal generator may be composed of a D flip-flop. This provides a simple signal generator, which takes up very little space.

Advantageously, the second analogue signal is generated in the receive circuit by means of a digital to analogue demodulator. The second analogue signal is hereby restored in a simple manner.

The transmission means may be a transformer, an optocoupler, including a light guide connection or other galvanic separation face. This provides a good separation face between transmit circuit and receive circuit.

BRIEF DESCRIPTION OF THE DRAWINGS

The invention will be explained more fully below with reference to the figures, in which

FIG. 7 shows a range of signals, associated with the block diagram of FIG. 5, using other codes.

DESCRIPTION OF THE INVENTION

An Example of a Problem Solved by the Invention

Figure 1A:
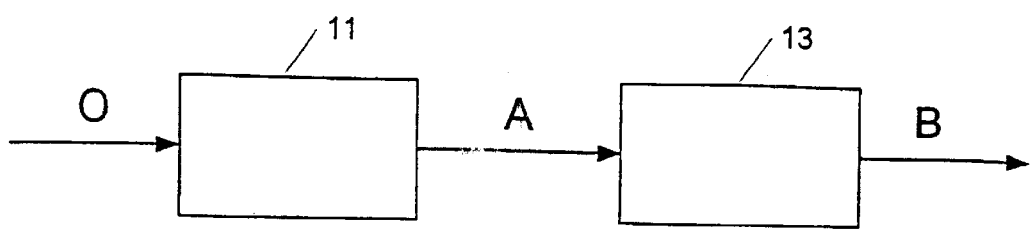
FIG. 1A shows a block diagram which illustrates a problem that is solved by the present invention.

FIG. 1A shows a block diagram which illustrates an example of a problem, which is solved by the present invention. A digital signal O containing information has been generated. This signal is transported, after generation, to a receiver part either via some transmission channels or via an electrical circuit before it is demodulated. Noise pulses or distortions of existing pulses may be introduced in the transport phase 11. This may be caused by unlinearities in transmission lines, electrical circuits or other obstacles, which the signal has to pass before it is to be demodulated again. Typically, a filter 13 will be used for removing the noise pulses, which however, distorts the pulses additionally. Thus, both the transmission lines and filters contribute to distorting the signal O.

Figure 1B:
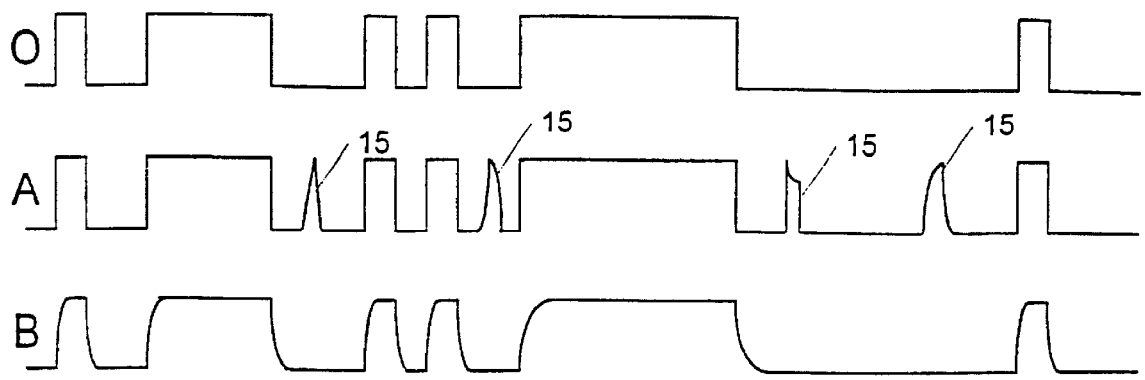
FIG. 1B shows the signals from the block diagram in 1A.

FIG. 1B shows a digital signal A where the pulses have been transported without having been distorted, but where noise pulses 15 have been introduced. When this signal is demodulated, it may be difficult to distinguish between a noise pulse 15 and one of the original pulses, in particular if the original pulses are very fast. Thus, there is a risk that wrong information is derived from the digital signal A. The noise pulses 15 are thus undesired and are removed by using a filter 13. This, however, has the drawback that particularly the higher frequencies of the pulses are attenuated and the signal B is generated. The distortion causes the flanks of the pulses to lose their well-defined positions. Particularly in case of the signals where the integrity in connection with the mutual positions of the flanks—i.e. the pulse width and the relative spacing between the pulses—is of essential importance, it may be a problem to re-generate the exact data from a signal with distorted pulses. The present invention enables restoration of the original signal O from a distorted signal B, thereby maintaining the integrity.

It should be noted that the present invention may be used for restoring all types of distorted digital signals so that the mutual spacing of the flanks is restored. It is thus not just signals, which have been distorted because of filtering, but also signals that have been distorted for other reasons mentioned above.

Finally, it should also be mentioned that it must not necessarily be a restoration that takes place. The present invention may also be used in cases where there is a pulse signal and it is desired to generate a pulse signal which has been timed from a given clock signal.

General Description of the Invention

Figure 2:
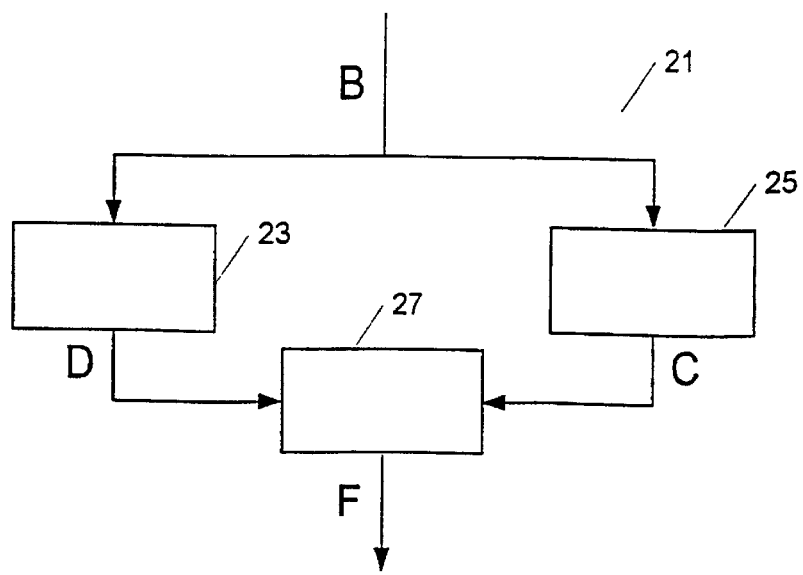
FIG. 2 shows a block diagram of the restoring principle.

FIG. 2 shows a block diagram of the principle in the generator 21, which, from a distorted signal B, generates a signal F where the flanks are well-defined and their mutual spacing has been restored.

The signal B is fed down to a shape generator 23 which shapes the distorted pulses in B to a shape signal D with uniform well-defined pulse flanks. This shaping results in a shape signal D where the relative position and width of the flanks are not in exact correspondence with the original signal O, but where pulses with uniform and well-defined flanks have been generated. This shaping may e.g. take place in that, on the basis of some limit values, a unit converts the values of the signal into a signal with two different levels.

A frequency generator 25 is used for generating a clock signal which is to be used for timing the shape signal D, so that the mutual spacing of the flanks is adapted to the clock which frequency generator generates, from B, a clock signal C containing the timing information from the signal B.

The information from the clock signal C and the shape signal B is combined in a signal generator 27 to a signal F containing the same information as O. This may e.g. take place by validating the shape signal D to the signal F on a clock pulse.

An Example of an Embodiment

Figure 3:
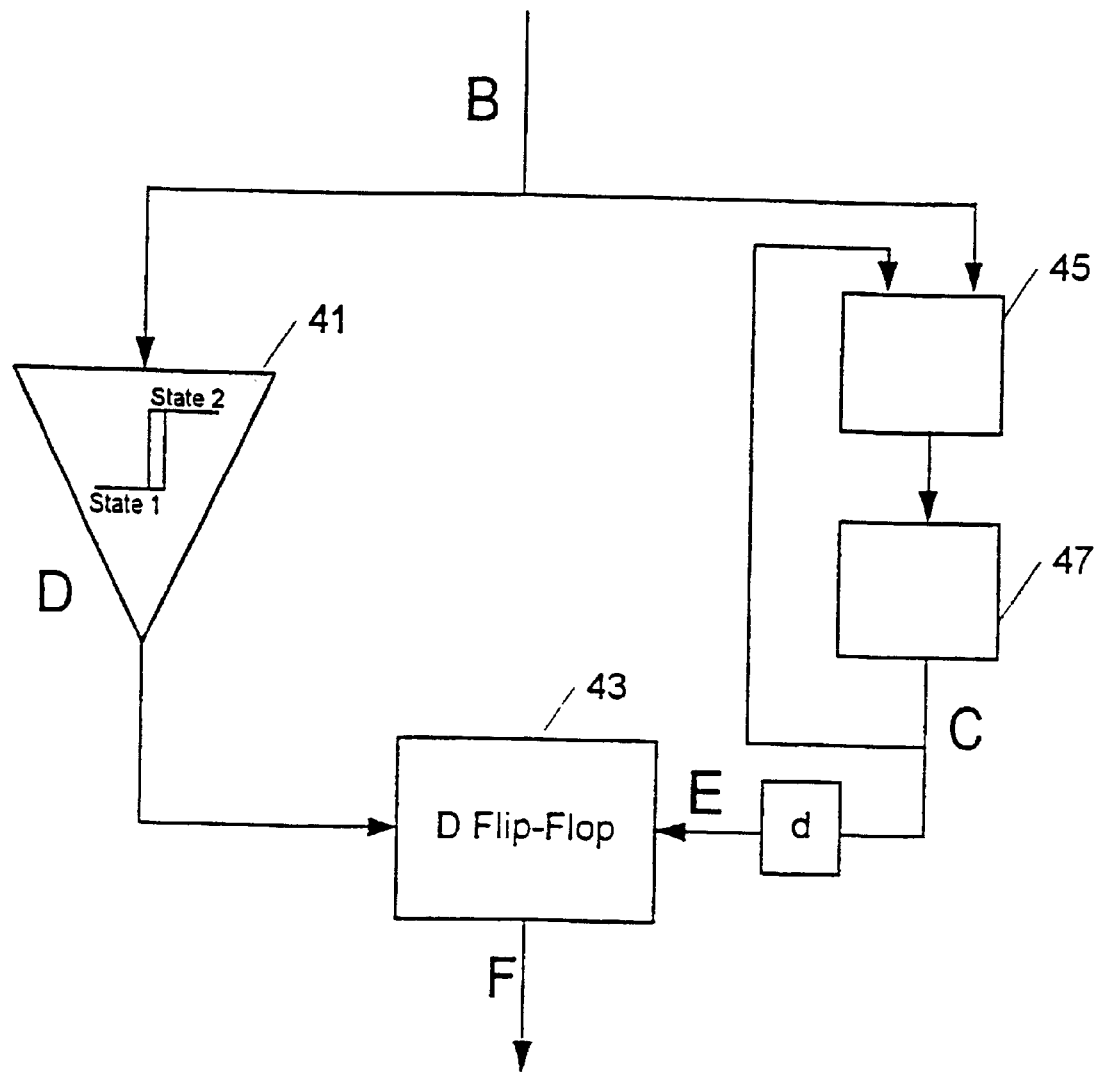
FIG. 3 shows the signals during the restoration.

FIG. 3 shows a possible embodiment of the generator 21. The shape generator 23 is here realized with a Smith trigger 41 which operates according to the following principle: When the signal B exceeds a predetermined value, then the output D switches to state 2, and when B gets lower than another given value, the output D switches to state 1. Thus, if it is desired to restore the signal O, state 1 and state 2 must be the same states between which switching takes place in the signal O.

The frequency generator 25 may be a PLL, also called a phase-locking loop, which operates in that in a phase comparator 45 it compares the phases of a reference signal B and a clock signal C generated by a controlled oscillator 47. The control signal for the oscillator 47 is regulated on the basis of the phase difference, thereby generating a clock signal C, which has the same clock and phase as the reference signal B. Since a phase locking loop is used, a clock signal C is generated which, in principle, is insensitive to nose or other irregularities in the signal B. For the signal to be restored with a given clock, it is necessary either that the clock is well-represented in the signal or prior knowledge of the clock is available, e.g. from the modulation of the signal. To save time and to find precisely the basic clock again, a minimum frequency and a maximum frequency between which the frequency generator may move, can be set.

Another way of restoring the clock of the signal might be the use of FFT.

In one embodiment, the actual signal generation may take place in that the clock signal C is delayed by a known size d to the clock signal E. Then, the clock signal E and the shape signal D are applied to a D flip-flop, thereby generating the signal F. The signal F is generated on the basis of the clock of the signal E. Each time a signal arrives, with switching from low to high, the current value is copied from D to F. Thus, signal F is generated wherein the mutual positions of the pulses and the clock of the signal have been restored, and, thus, the information from O (FIG. 1) may now be derived from F (FIGS. 2 and 3).

Figure 4:
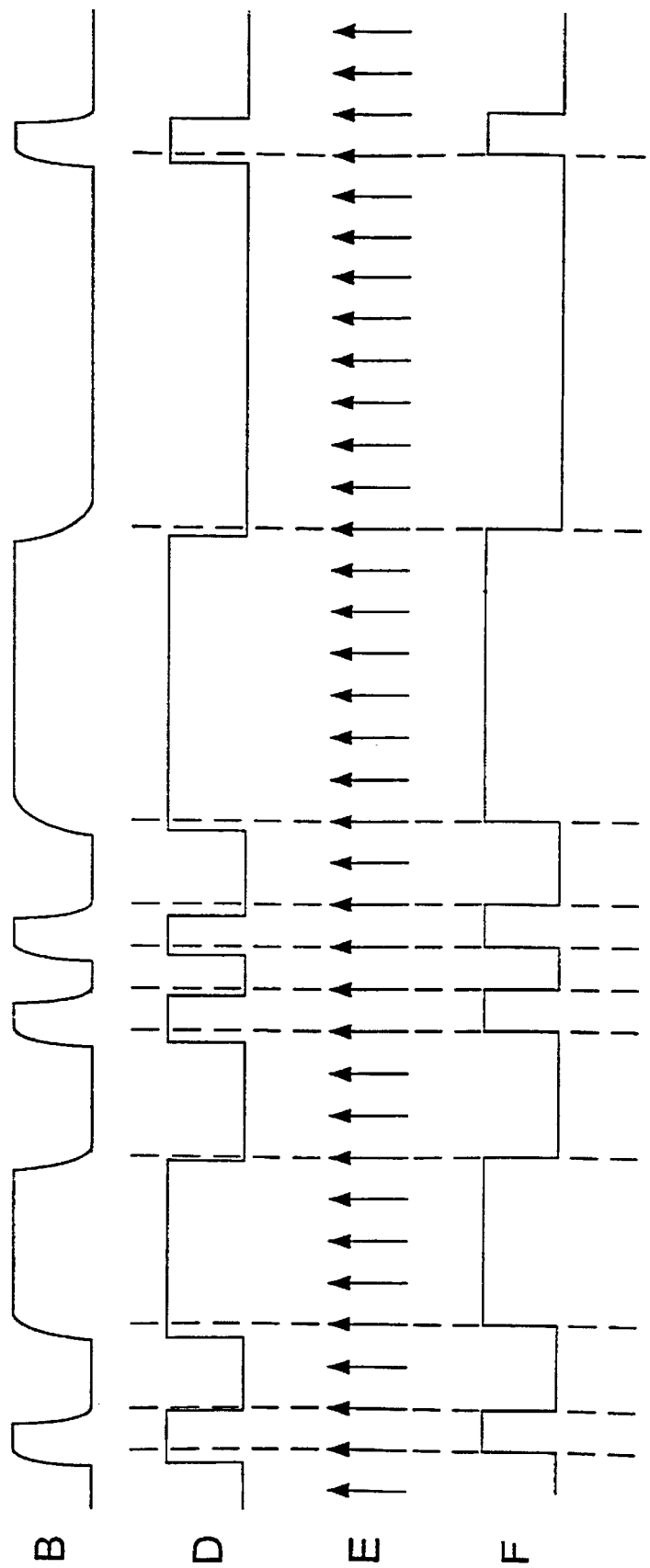
FIG. 4 shows a particular embodiment of the generator.

FIG. 4 shows the signals during the restoration mentioned in the foregoing. It is noted that the shifting d causes restoration of signal F which is phase-shifted by a known size relative to the original signal. This, however, is of no significance relative to the information in the signal, but merely means that the data demodulated from the signal are delayed relative to O. The shifting d may be determined according to the size of the time distortion in the shape signal D, but is typically very small relative to the overall delay in the rest of the systems in which the digital signals are used.

Figure 5:
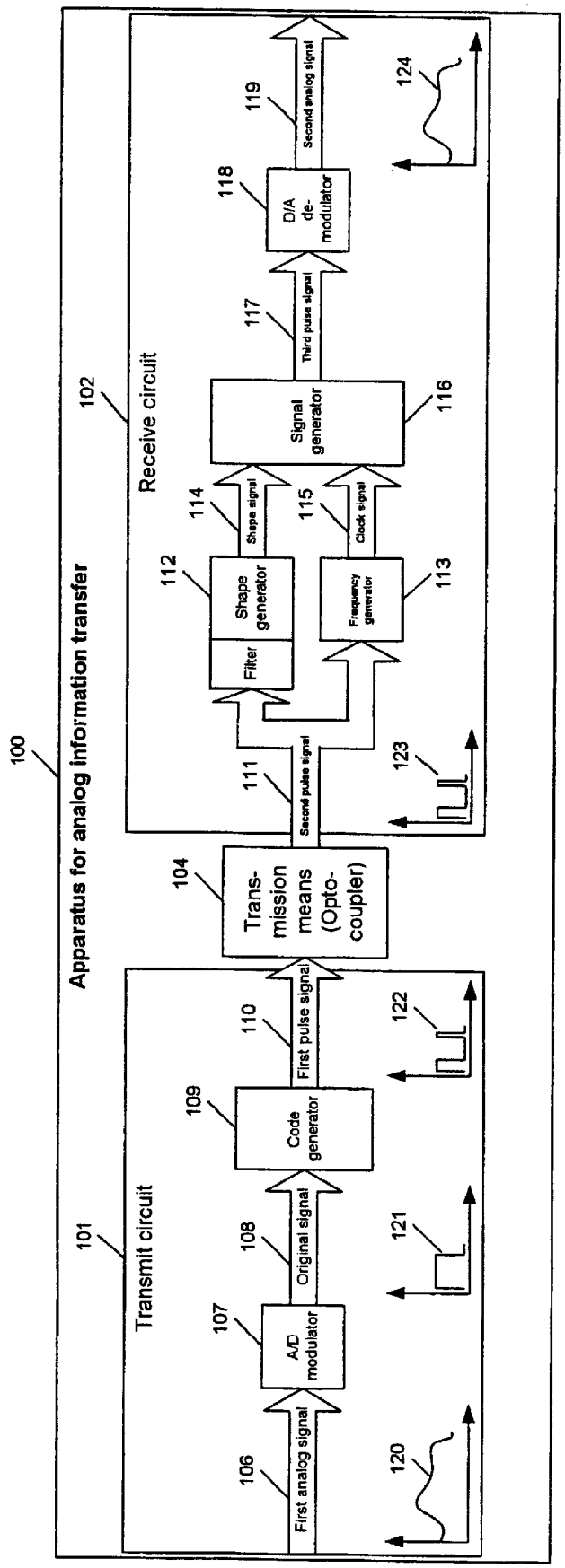
FIG. 5 shows a block diagram of an apparatus for analogue information transfer.

FIG. 5 shows an apparatus for analogue information transfer 100 which consists of a transmit circuit 101 and a receive circuit 102 that are interconnected via a transmission means 104. An A/D modulator 107 in the transmit circuit 101 and a receive circuit 102 that are interconnected via a transmission means 104. An A.D. modulator 107 in the transmit circuit 101 receives a first analogue signal 106 with an analogue curve shape 120 on the input. The A.D modulator 107 converts the first analogue signal 106 into an original signal 108 with a digital curve shape 121. The original signal 108 is fed to a code generator 109 which converts the original signal 108 into a first pulse signal 110 with the curve shape 122. The first pulse signal 110 is fed to the receive circuit 102 via the transmission means 104, so that the receive circuit 102 receives a second pulse signal 111 with the curve shape 123. The second pulse signal 111 is fed to a frequency generator 113 and a shape generator 112. The shape generator 112 generates a shape signal 114 which is fed to a signal generator 116. The frequency generator 113 generates a clock signal 115 which is fed to the signal generator 116. The signal generator 116 generates a third pulse signal 117 which is fed to a D/A demodulator 118. The D/A modulator 118 generates a second analogue signal 119 with an analogue curve shape 124 which is fed to the output.

Figure 6:
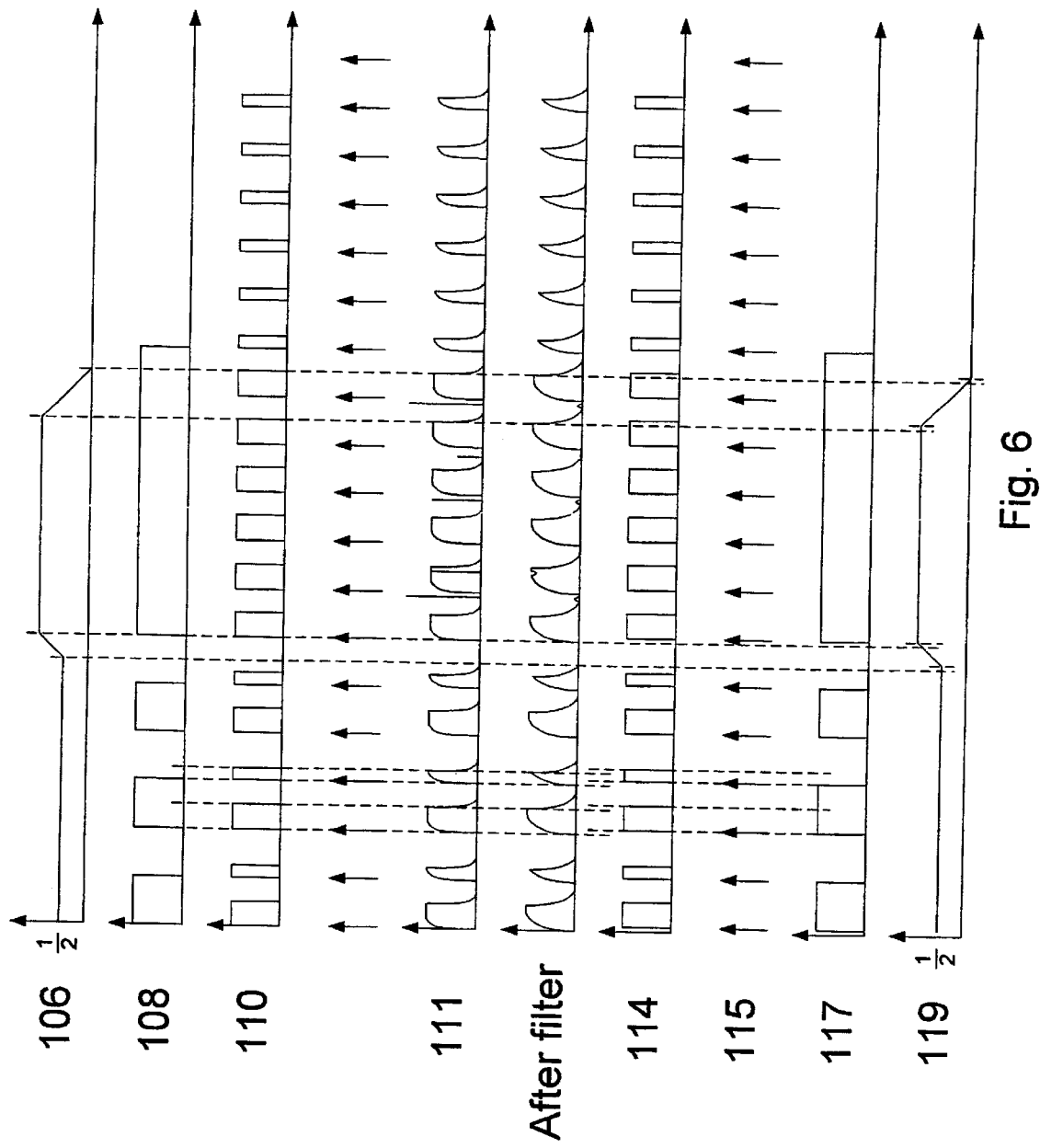
FIG. 6 shows signals during restoration, associated with the block diagram of FIG. 5.

FIG. 6 shows signals during restoration, associated with an apparatus for analogue information transfer 100. A first analogue signal 106 is visible on the first curve. The associated original signal 108 is visible on the second curve. The associated first pulse signal 110 is visible on the third curve. Then, marking of the clock for the signals in the transmit circuit 101 is visible. The second pulse signal 111 is visible on the fourth curve, corresponding to the first pulse signal 110 after reception in the receive circuit 102. A filtered signal corresponding to the second pulse signal 111 after filtering is visible on the fifth curve. The associated shape signal 114 is visible on the sixth curve, phase-shifted relative to the preceding signals, but with the phase between the pulses maintained. Then, marking of the clock in the receive circuit 102 corresponding to the clock signal 115 is visible. The third pulse signal 117 is visible on the seventh curve. The second analogue signal 119 is visible on the eight curve.

FIG. 7 shows a range of signals associated with an apparatus for analogue information transfer 100, but using other types of codes. The original signal 108 is visible on the first curve. The associated first pulse 110 using the coding shape 201 is visible on the second curve. The first pulse signal 110 is visible on the third curve if the coding shape is used instead. The first pulse signal 110 is visible on the fourth curve if the coding shape 203 is used instead. Then marking of the clock of the signals in the transmit circuit 101 is visible.

What is claimed is:

1. An apparatus for analogue information transfer which comprises a transmit circuit and a receive circuit, said transmit circuit communicating with the receive circuit through a transmission means, transmit circuit generating, from a first analogue signal, a first pulse signal which is transferred to the receive circuit via the transmission means, said receive circuit generating a second analogue signal from a second pulse signal, wherein the first pulse signal consists of a series of coded pulses, wherein a first code marks a positive flank, while a second code marks a negative flank, wherein the receive circuit comprises a shape generator which generates a shape signal with uniform and well-defined flanks from the second pulse signal, wherein the spacing between flanks approximately corresponds to the spacing between a first code and a second code in the first pulse signal, where rising and falling edges of the binary information are aligned with clock markings, where a refresh pulse identical with the preceding information pulse is generated, wherever the digital information does not have an edge at the respective clock marking, and wherein the receive circuit moreover contains a frequency generator which generates a clock sign on the basis of the coded pulses of the second and pulse signal, wherein a signal generator from a third pulse signal from the clock signal and the shape signal, said third pulse signal generating the second analogue signal after D/A demodulation.

2. An apparatus according to claim 1, wherein the first pulse signal transmits a code pulse at fixed intervals.

3. An apparatus according to claim 1, wherein the first pulse signal contains a code pulse for a transmit clock signal.

4. An apparatus according to claim 1, wherein the first pulse signal contains a fist code for marking a positive flank and a second code for a negative flank, said first and second codes being transmitted at first intervals in dependence on an original signal.

5. An apparatus according to claim 1, wherein the original signal is converted by a code generator into the first pulse signal, said code generator supplying a clock and performing coding in dependence on the clock.

6. An apparatus according to claim 1, wherein the original signal is generated by an analogue to digital modulator.

7. An apparatus according to claim 1, wherein the original signal is generated by a sigma delta modulator.

8. An apparatus according to claim 1, wherein the receive circuit recognizes coded pulses and restores the original signal on the basis of the codes.

9. An apparatus according to claim 1, wherein the receive circuit restores the original signal by generating a positive state of the signal on the basis of the first code, while the second code generates the negative state of the signal.

10. An apparatus according to claim 1, wherein the receive circuit restores the clock from the coded signal, said restored clock being used for determining the flanks of the signal.

11. An apparatus according to claim 1, wherein the receive circuit generates a clock on the basis of the received signal.

12. An apparatus according to claim 1, wherein the receive circuit contains a low-pass (LP) filtering of the second pulse signal.

13. An apparatus according to claim 1, wherein the frequency generator is built as a phase-locked loop.

14. An apparatus according to claim 1, wherein the frequency generator searches for the clock within a predetermined frequency interval.

15. An apparatus according go claim 1, wherein the shape generator is built as an analogue switching element, such as e.g. a Smith trigger.

16. An apparatus according to claim 1, wherein the signal generator is composed of a D flip-flop.

17. An apparatus according to claim 1, wherein the second analogue signal in the receive circuit is generated by means of a digital to analogue demodulator.

* * * * *